United States Patent
Oh et al.

(10) Patent No.: US 8,035,418 B2
(45) Date of Patent: Oct. 11, 2011

(54) OUTPUT DRIVER

(75) Inventors: Ic-Su Oh, Gyeonggi-do (KR); Hyung-Soo Kim, Gyeonggi-do (KR); Chang-Kun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/832,167

(22) Filed: Jul. 8, 2010

(65) Prior Publication Data

US 2011/0128043 A1 Jun. 2, 2011

(30) Foreign Application Priority Data

Nov. 30, 2009 (KR) .................. 10-2009-0117399

(51) Int. Cl.
*H03K 19/094* (2006.01)
(52) U.S. Cl. ............. 326/87; 326/30; 326/33; 327/109; 327/112; 327/535
(58) Field of Classification Search ............. 326/30–31, 326/33, 82–83, 86–87; 327/108–109, 112, 327/534–535
See application file for complete search history.

(56) References Cited

U.S. PATENT DOCUMENTS

| 4,837,460 | A | * | 6/1989 | Uchida | 327/382 |
| 5,461,338 | A | * | 10/1995 | Hirayama et al. | 327/534 |
| 5,969,564 | A | * | 10/1999 | Komatsu et al. | 327/534 |
| 6,046,627 | A | * | 4/2000 | Itoh et al. | 327/546 |
| 6,094,068 | A | * | 7/2000 | Nomura et al. | 326/83 |
| 6,232,793 | B1 | * | 5/2001 | Arimoto et al. | 326/34 |
| 6,765,430 | B2 | * | 7/2004 | Ando | 327/534 |
| 6,833,749 | B2 | * | 12/2004 | Erstad | 327/534 |
| 7,498,867 | B2 | * | 3/2009 | Satoh | 327/537 |
| 7,602,208 | B2 | * | 10/2009 | Jung | 326/30 |
| 7,808,270 | B2 | * | 10/2010 | Fujisawa | 326/30 |
| 2007/0182458 | A1 | * | 8/2007 | Park et al. | 327/51 |
| 2007/0205802 | A1 | * | 9/2007 | Perisetty | 326/27 |
| 2008/0136499 | A1 | * | 6/2008 | Burr et al. | 327/534 |
| 2009/0243667 | A1 | * | 10/2009 | Park et al. | 327/109 |
| 2010/0214009 | A1 | * | 8/2010 | Fechner | 327/534 |

* cited by examiner

*Primary Examiner* — Jason M Crawford
(74) *Attorney, Agent, or Firm* — IP&T Group LLP

(57) ABSTRACT

An output driver of a semiconductor device includes driving transistors and a body bias providing unit. The driving transistors are coupled in parallel and configured to drive an output terminal. The body bias providing unit is configured to supply the driving transistors with respective body biases of at least two levels.

14 Claims, 4 Drawing Sheets

OUTPUT DRIVER

CROSS-REFERENCE TO RELATED APPLICATIONS

The present application claims priority of Korean Patent Application No. 10-2009-0117399, filed on Nov. 30, 2009, which is incorporated herein by reference in its entirety.

BACKGROUND OF THE INVENTION

Exemplary embodiments of the present invention relate to a digital circuit, and more particularly, to an output driver which outputs an input signal to an external circuit.

In a digital circuit, an output driver transfers a generated signal to other chips. Hence, a final output stage must have higher drivability than any other internal circuit. To this end, an output driver includes a pull-up driver and a pull-down driver. The pull-up driver includes a plurality of PMOS transistors which are coupled in parallel in order to increase a voltage of an output terminal, and the pull-down driver includes a plurality of NMOS transistors which are coupled in parallel in order to lower a voltage of an output terminal.

The pull-up driver refers to a driver which increases current drivability, that is, implements a pull-up driving operation. The pull-down driver refers to a driver which lowers current drivability, that is, implements a pull-down driving operation. The pull-up driving operation means that a specific node of a circuit is coupled to a power supply voltage (VDD) by an active element such as a pull-up transistor. The pull-up driving operation increases an output gain and lowers an output impedance, as compared with a case in which the pull-up driving operation is performed using a resistor. The pull-down driving operation means that a specific node of a circuit is coupled to a ground (VSS) by an active element such as a pull-down transistor. A current gain or an operating speed can be improved, as compared to a case in which the pull-down driving operation is performed using a resistor.

FIG. 1 is a circuit diagram of a conventional output driver.

As shown, the output driver includes a pull-up driving unit 110, a pull-down driving unit 120, a pull-up resistor RU, and a pull-down resistor RD. Specifically, the pull-up driving unit 110 includes a plurality of PMOS transistors coupled in parallel, and the pull-down driving unit 120 includes a plurality of NMOS transistors coupled in parallel. The pull-up resistor RU is coupled between drains of the PMOS transistors and an output terminal, and the pull-down resistor RD is coupled between drains of the NMOS transistors and the output terminal.

FIGS. 2 and 3 are waveform diagrams illustrating an input signal IN inputted to the input terminal INPUT of the output driver and an output signal OUT outputted from the output terminal OUTPUT of the output driver.

When an ideal square wave is inputted as illustrated in FIG. 2, a substantially ideal square wave is also outputted. However, while passing through a package, a printed circuit board (PCB), and so on, the output waveform of the output driver includes harmonic components dispersing outside the circuit or module. In particular, when the output waveform is close to the ideal square wave, as illustrated in FIG. 2, means that many third-order, fifth-order and seventh-order harmonic components are included in the output waveform. This causes an electromagnetic interference (EMI) problem related to the magnitude of the harmonic components. To solve the EMI problem, a slew rate of the output signal OUT is limited as illustrated in FIG. 3 which shows the waveform of the final output terminal. The slew rate may be defined as a voltage change rate with respect to time when the output signal OUT changes from a high level to a low level or changes from a low level to a high level in response to the square wave input signal IN of a system. In a system requiring a high-speed signal transmission, the slew rate is an important factor in determining the characteristics of the system.

Conventionally, as illustrated in FIG. 3, methods of adjusting the slew rate of the input signal have been used to adjust the slew rate of the output signal OUT. That is, in order to solve the EMI problem, the slew rate of the output signal OUT is reduced by reducing the slew rate of the input signal IN. However, as the slew rate of the input signal of the output driver is lowered, the output driver becomes more vulnerable to power noise, causing distortion of the output waveform.

SUMMARY OF THE INVENTION

An embodiment of the present invention is directed to an output driver of a semiconductor device, which can adjust a slew rate of an output waveform regardless of a slew rate of an input waveform.

In accordance with an embodiment of the present invention, an output driver of a semiconductor device includes driving transistors coupled in parallel and configured to drive an output terminal, and a body bias providing unit configured to supply the driving transistors with respective body biases of at least two levels.

In accordance with another embodiment of the present invention, an output driver of a semiconductor device includes pull-up driving transistors coupled in parallel and configured to pull-up drive an output terminal, a first body bias providing unit configured to supply the pull-up driving transistors with respective first body biases of at least two levels, pull-down driving transistors coupled in parallel and configured to pull-down drive the output terminal, and a second body bias providing unit configured to supply the pull-down driving transistors with respective second body biases of at least two levels.

In accordance with still another embodiment of the present invention, an output driver of a semiconductor device includes driving transistors coupled in parallel and configured to drive an output terminal, and a body bias providing unit configured to include resistor elements respectively coupled between a power supply voltage terminal and bodies of the driving transistors to supply the driving transistors with respective body biases of different levels.

DESCRIPTION OF EXEMPLARY EMBODIMENTS

Figure 1:
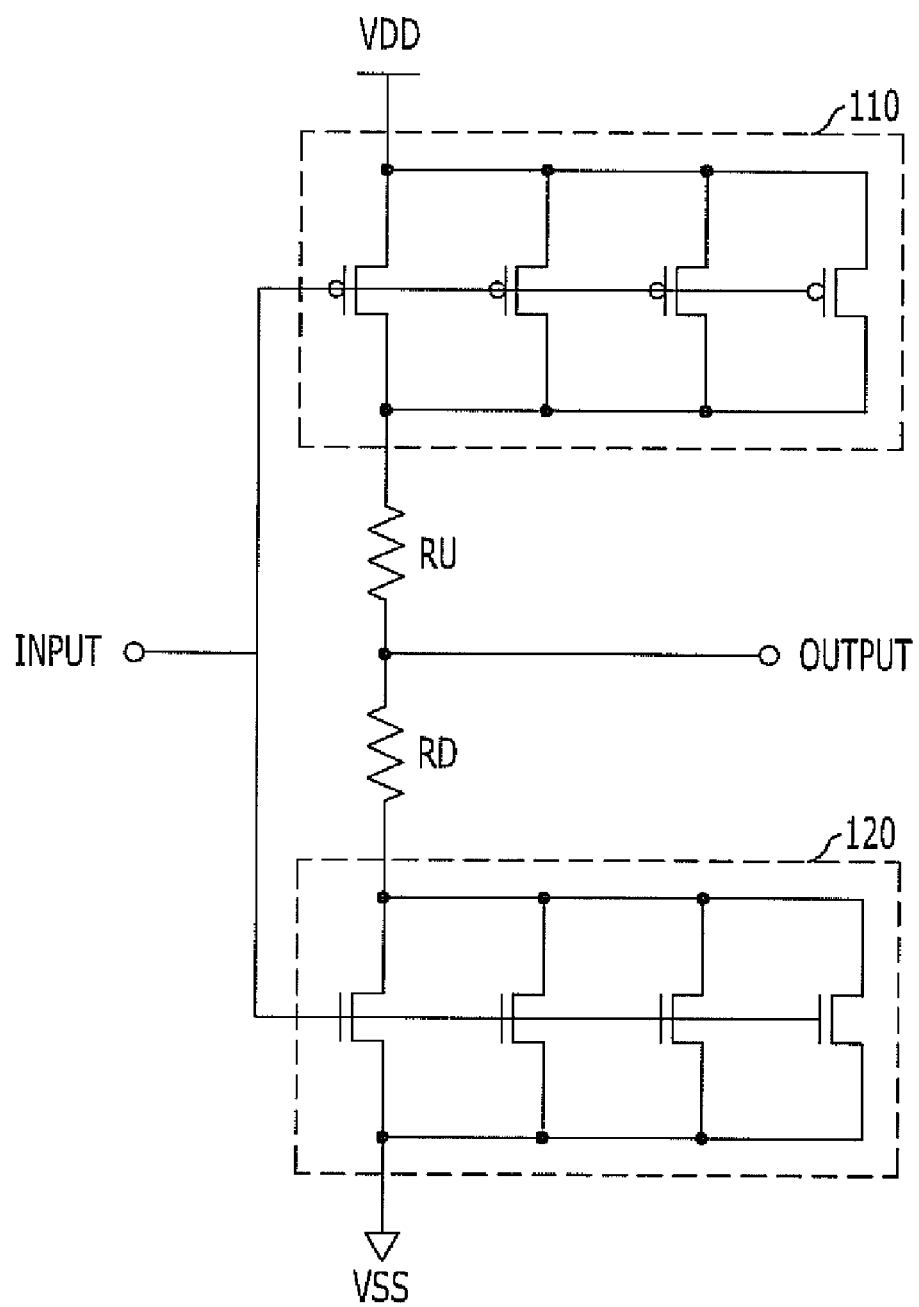
FIG. 1 is a circuit diagram of a conventional output driver.
Figure 2:
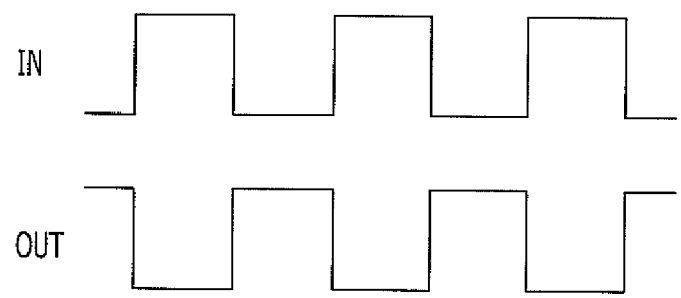
FIGS. 2 and 3 are waveform diagrams of an input signal and an output signal.
Figure 3:
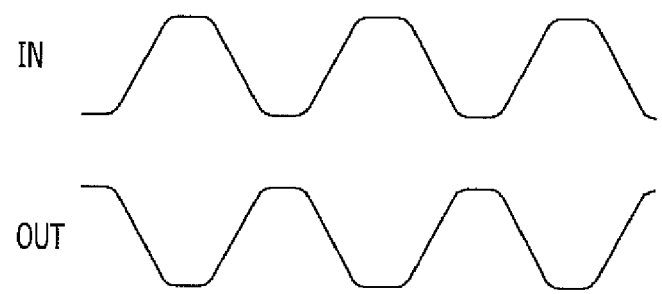

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
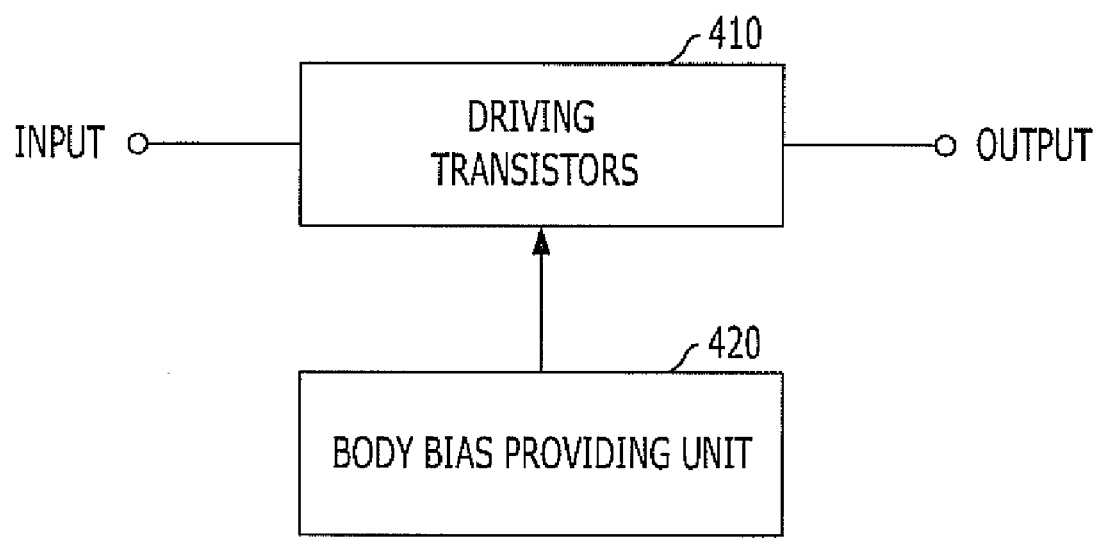
FIG. 4 is a block diagram of an output driver in accordance with an embodiment of the present invention.

FIG. 4 is a block diagram of an output driver in accordance with an embodiment of the present invention.

Referring to FIG. 4, the output driver includes an input terminal INPUT, a plurality of driving transistors 410, an output terminal OUTPUT and a body bias providing unit 420.

The input terminal INPUT is configured to receive an input signal. The plurality of driving transistors 410 is configured to receive the input signal and to drive the output terminal OUTPUT. The output terminal OUTPUT is configured to output the output signal. The body bias providing unit 420 is configured to supply the plurality of driving transistors 410 with respective body biases of two or more levels. The plurality of driving transistors 410 are coupled in parallel to a power supply voltage terminal or a ground voltage terminal.

Figure 5:
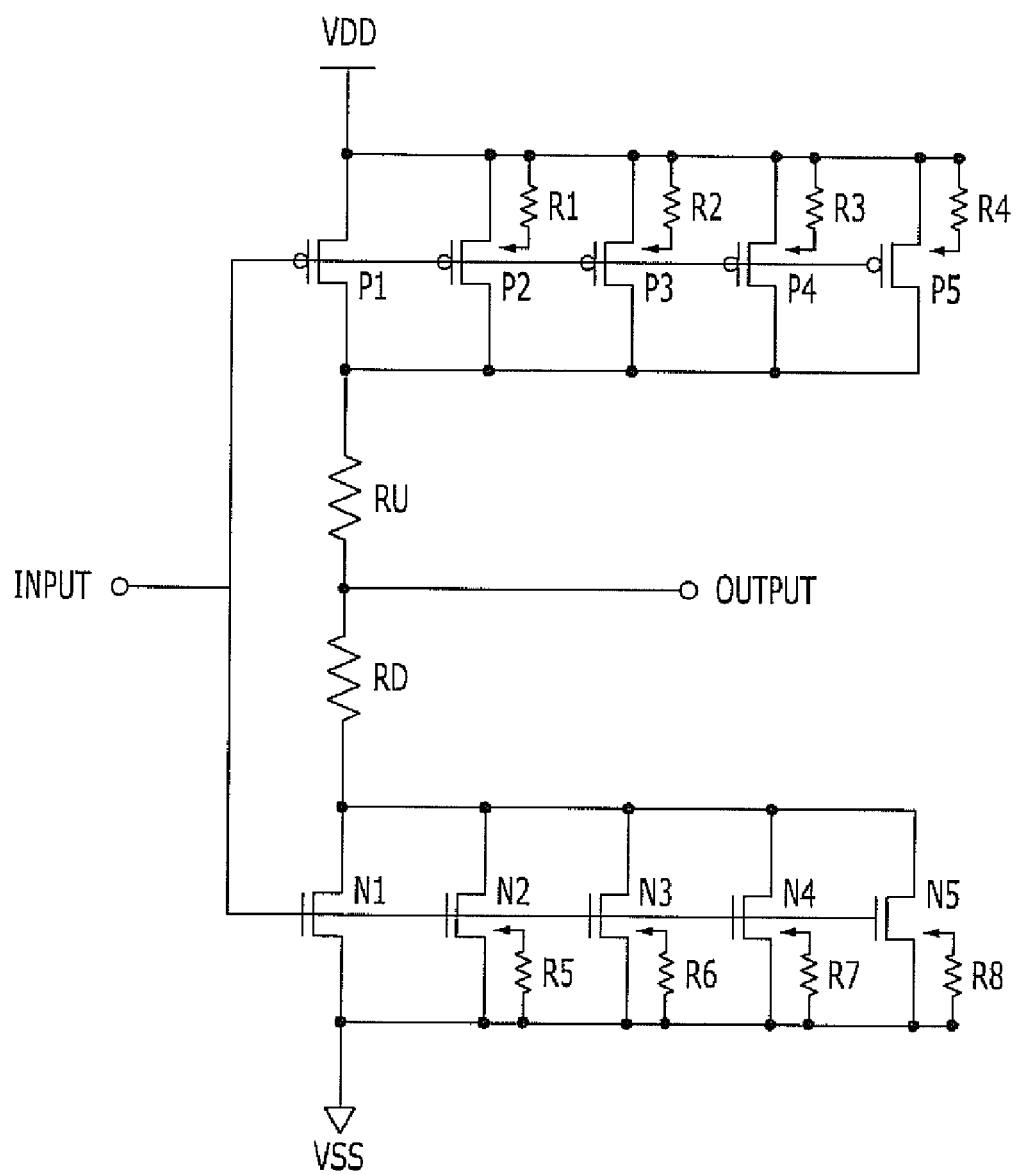
FIG. 5 is a circuit diagram of an output driver in accordance with an embodiment of the present invention.

FIG. 5 is a circuit diagram of an output driver in accordance with an embodiment of the present invention.

Referring to FIG. 5, the output driver includes an input terminal INPUT, an output terminal OUTPUT, a plurality of pull-up driving transistors P1, P2, P3, P4 and P5, a plurality of pull-down driving transistors N1, N2, N3, N4 and N5, a first body bias providing unit, a second body bias providing unit, a pull-up resistor PU, and a pull-down resistor PD.

The plurality of pull-up driving transistors P1, P2, P3, P4 and P5 are coupled in parallel. The first body bias providing unit may include resistors having two or more resistance values in order to adjust the respective body biases of the pull-up transistors P1, P2, P3, P4 and P5. The plurality of pull-down driving transistors N1, N2, N3, N4 and N5 are also coupled in parallel. The second body bias providing unit may include resistors having two or more resistance values in order to adjust the respective body biases of the pull-down transistors N1, N2, N3, N4 and N5. The pull-up transistors P1, P2, P3, P4 and P5 may be implemented with PMOS transistors, and the pull-down transistors N1, N2, N3, N4 and N5 may be implemented with NMOS transistors. The first body bias providing unit may include resistors R1, R2, R3 and R4 coupled between the respective pull-up transistors P1, P2, P3, P4 and P5 and a power supply voltage terminal VDD, and the second body bias providing unit may include resistors R5, R6, R7 and R8 coupled between the respective pull-down transistors N1, N2, N3, N4 and N5 and a ground voltage terminal VSS. The pull-up resistor RU may be coupled between the output terminal OUTPUT and drains of the pull-up transistors P1, P2, P3, P4 and P5, and the pull-down resistor RD may be coupled between the output terminal OUTPUT and drains of the pull-down transistors N1, N2, N3, N4 and N5. The input terminal INPUT may be coupled to gates of the respective pull-up transistors P1, P2, P3, P4 and P5 and the respective pull-down transistors N1, N2, N3, N4 and N5. Sources of the respective pull-up transistors P1, P2, P3, P4 and P5 may be coupled to the power supply voltage terminal VDD, and sources of the respective pull-down transistors N1, N2, N3, N4 and N5 may be coupled to the ground voltage terminal VSS.

Hereinafter, the operation of the output driver will be described below with reference to FIG. 5.

First, a pull-down driving operation will be described in detail. For convenience of explanation, it is assumed that the resistors R5, R6, R7 and R8 included in the second body bias providing unit have a resistance relationship of R5<R6<R7<R8. When a voltage is applied to the drains of the pull-down transistors N1, N2, N3, N4 and N5, a substrate current causes voltage drops due to the resistors R5, R6, R7 and R8. The voltage drops due to the resistors R5, R6, R7 and R8 become body biases of their corresponding transistors. In the case of an NMOS transistor, when the body bias increases, the threshold voltage of the transistor decreases. Since the resistors R5, R6, R7 and R8 included in the second body bias providing unit have the resistance relationship of R5<R6<R7<R8, the threshold voltages of the pull-down transistors N1, N2, N3, N4 and N5 increase in the following order: N1<N2<N3<N4<N5. Therefore, when a high level signal is applied to the input terminal INPUT, the NMOS transistor N1 is first turned on, and the NMOS transistors N2, N3, N4 and N5 are then sequentially turned on. The different turn-on timings cause the difference of drivability. Using the difference of drivability, the falling slew rate of the signal outputted from the output terminal OUTPUT can be adjusted.

Next, a pull-up driving operation will be described in detail. For convenience of explanation, it is assumed that the resistors R1, R2, R3 and R4 included in the first body bias providing unit have a resistance relationship of R1<R2<R3<R4. When a voltage is applied to the drains of the pull-up transistors P1, P2, P3, P4 and P5, a substrate current causes voltage drops due to the resistors R1, R2, R3 and R4. The voltage drops due to the resistors R1, R2, R3 and R4 become body biases of their corresponding transistors. In the case of a PMOS transistor, when the body bias decreases, the threshold voltage of the transistor decreases. Since the resistors R1, R2, R3 and R4 included in the first body bias providing unit have the resistance relationship of R1<R2<R3<R4, the threshold voltages of the pull-up transistors increase in the following order: P1<P2<P3<P4<P5. Therefore, when a low level signal is applied to the input terminal INPUT, the PMOS transistor P1 is first turned on, and the PMOS transistors P2, P3, P4 and P5 are then sequentially turned on. The different turn-on timings cause the difference of drivability. Using the difference of drivability, the rising slew rate of the signal outputted from the output terminal OUTPUT can be adjusted.

In accordance with the embodiments of the present invention, the slew rate of the output signal is controlled by using the different turn-on timings of the pull-up and pull-down transistors P1, P2, P3, P4 and P5 and N1, N2, N3, N4 and N5. Thus, the slew rate of the input waveform can be improved and the output signal becomes insensitive to power noise.

While the present invention has been described with respect to the exemplary embodiments, it will be apparent to those skilled in the art that various changes and modifications may be made without departing from the spirit and scope of the invention as defined by the following claims.

What is claimed is:

1. An output driver of a semiconductor device, comprising:
a plurality of driving transistors coupled in parallel and configured to drive an output terminal; and
a body bias providing unit configured to supply the plurality of driving transistors with respective body biases of at least two levels, wherein the body bias providing unit comprises a plurality of resistor elements that are each coupled between a power supply voltage terminal and a body of a respective driving transistor.

2. The output driver of claim 1, wherein each of the resistor elements has a different resistance.

3. The output driver of claim 2, wherein each resistor element adjusts a threshold voltage of the respective driving transistor by controlling a body bias of the respective driving transistor.

4. The output driver of claim 2, wherein a threshold voltage of the respective driving transistor decreases as the resistance of a respective one of the resistor elements decreases.

5. The output driver of claim 1, further comprising:
an output resistor coupled between a common node of the plurality of driving transistors and the output terminal.

6. An output driver of a semiconductor device, comprising:
a plurality of pull-up driving transistors coupled in parallel and configured to pull-up drive an output terminal;
a first body bias providing unit configured to supply the plurality of pull-up driving transistors with respective first body biases of at least two levels, wherein the first body bias providing unit comprises a plurality of first resistors that are each coupled between a power supply voltage terminal and a body of a respective pull-up driving transistor;
a plurality of pull-down driving transistors coupled in parallel and configured to pull-down drive the output terminal; and
a second body bias providing unit configured to supply the plurality of pull-down driving transistors with respective second body biases of at least two levels.

7. The output driver of claim 6, wherein each of the first resistors has a different resistance.

8. The output driver of claim 7, wherein each first resistor element decreases a body bias of the respective pull-up driving transistor to decrease a threshold voltage of the respective pull-up driving transistor.

9. The output driver of claim 7, wherein a threshold voltage of the respective pull-up driving transistor decreases as the resistance of respective first resistor element decreases.

10. The output driver of claim 6, wherein the second body bias providing unit comprises a plurality of second resistors that are each coupled between a ground voltage terminal and a body of a respective pull-down driving transistor and each have a different resistance.

11. The output driver of claim 10, wherein each second resistor element increases a body bias of the respective pull-down driving transistor to decrease a threshold voltage of the respective pull-down driving transistor.

12. The output driver of claim 10, wherein a threshold voltage of the respective pull-down driving transistor decreases as the resistance of a respective one of second resistor elements decreases.

13. The output driver of claim 6, further comprising:
a pull-up resistor coupled between the output terminal and a common node of the plurality of pull-up driving transistors; and
a pull-down resistor coupled between the output terminal and a common node of the plurality of pull-down driving transistors.

14. An output driver of a semiconductor device, comprising:
a plurality of driving transistors coupled in parallel and configured to drive an output terminal; and
a body bias providing unit configured to include a plurality of resistor elements respectively coupled between a power supply voltage terminal and bodies of the plurality of driving transistors to supply the plurality of driving transistors with respective body biases of different levels.

* * * * *